United States Patent
Haslach

(10) Patent No.: US 7,697,635 B2
(45) Date of Patent: Apr. 13, 2010

(54) METHOD AND APPARATUS FOR CONTROLLING THE DECISION POINT OF A RECEIVER FOR DIGITAL COMMUNICATION SIGNALS

(75) Inventor: Christoph Haslach, Stuttgart (DE)

(73) Assignee: Alcatel, Paris (FR)

( * ) Notice: Subject to any disclaimer, the term of this patent is extended or adjusted under 35 U.S.C. 154(b) by 785 days.

(21) Appl. No.: 11/546,344

(22) Filed: Oct. 12, 2006

(65) Prior Publication Data

US 2007/0092037 A1 Apr. 26, 2007

(30) Foreign Application Priority Data

Oct. 21, 2005 (EP) .................................. 05292228

(51) Int. Cl.
*H04L 25/06* (2006.01)
(52) U.S. Cl. ........................ 375/317; 375/316; 375/371; 375/372; 375/373; 375/374; 375/375; 375/376; 329/307; 327/147
(58) Field of Classification Search ................. 375/317, 375/316, 371–376; 329/307; 327/147
See application file for complete search history.

(56) References Cited

U.S. PATENT DOCUMENTS

| | | | |
|---|---|---|---|
| 5,896,392 A | | 4/1999 | Ono et al. |
| 6,538,779 B1 * | | 3/2003 | Takeshita et al. ............... 398/27 |
| 2004/0203559 A1 * | | 10/2004 | Stojanovic et al. .......... 455/403 |

FOREIGN PATENT DOCUMENTS

| EP | 0 455 910 A2 | 11/1991 |
|---|---|---|
| EP | 0 923 204 B1 | 2/2005 |
| WO | WO 03/039060 A2 | 5/2003 |

OTHER PUBLICATIONS

M. Kawai et al, "Smart Optical Receiver with Automatic Decision Threshold Setting and Retiming Phase Alignment", Journal of Lightwave Technology, IEEE Service Center, New York, NY US, vol. 7, No. 11, Nov. 1989.
M. Sherif et al, "Decision-Point Steering in Optical Fibre Communications Systems: theory", IEE Proceedings, vol. 136, PT J, o. 3, Jun. 1989, pp. 169-176, XP-001153732.

* cited by examiner

*Primary Examiner*—David C Payne
*Assistant Examiner*—Zewdu Kassa
(74) *Attorney, Agent, or Firm*—Carmen Patti Law Group, LLC

(57) ABSTRACT

A receiver for a digital communication signal has a first decision gate (DGa), which has a first decision threshold (xd) for outputting a first decision signal, a second decision gate (DGb), which has a second decision threshold (xm) for outputting a second decision signal, a counter (CNT) for counting events where the first and second decision signals of the first and second decision gates (DGa, DGb) differ from each other, and a controller (PROC) capable of controlling the decision thresholds of said first and second decision gates in accordance with count values delivered by said counter. The controller (PROC) determines an initial decision threshold value by performing a statistical analysis of the received signal and setting the decision threshold such that the distribution of logical '0' and logical '1' in the decided signal corresponds to the expected distribution, which is in typically 50%/50%.

7 Claims, 3 Drawing Sheets

METHOD AND APPARATUS FOR CONTROLLING THE DECISION POINT OF A RECEIVER FOR DIGITAL COMMUNICATION SIGNALS

The invention is based on a priority application EP 05292228.3 which is hereby incorporated by reference.

FIELD OF THE INVENTION

The present invention relates to the field of telecommunications and more particularly to a method and apparatus for controlling the decision point of a receiver for digital communication signals.

BACKGROUND OF THE INVENTION

In telecommunication networks, digital signals undergo signal distortion due to dispersion and other physical effects on their way through the network. At the receiver side, the received digital signal must be regenerated to recover the original signal. This regeneration includes a decision step wherein the received "analogue" signal, after O/E conversion, pre-filtering and/or dispersion compensation where necessary, is compared to a decision threshold at regular instants in time, which correspond to the data clock of the received signal, to decide the respective bit values of the corresponding signal bits.

This comparison requires an accurately adjusted decision threshold. The more noise the received signal carries, the more accurate must the decision point be adjusted to achieve correct decisions with sufficiently low bit error rate. Decision threshold and decision phase are, however, heavily signal dependent. These parameters must be adjusted automatically so as to obtain "good" decisions for all relevant signal waveforms.

The article "Decision-point steering in optical fibre communication systems: theory" by M. Sherif et al., IEE Proceedings, Vol. 136, Pt. J, No. 3 June 1989, describes a regenerator with a pseudo error monitor, which has a shifted threshold and which serves to produce a pseudo error signal that steers the decision threshold of a decision gate. Using the pseudo error signal as a feedback signal, the decision threshold is dynamically optimized.

This optimization requires "reasonable" starting values, particularly for optical signals that have, undergone massive signal dispersion. Fixed starting values can be used but which is not very flexible and is applicable only for restricted set of waveforms. Alternatively, it would be possible to use information on the signal quality, i.e., the bit error rate, from other, external sources to initially control the threshold and/or phase using this information. An external source may for example be the Forward Error Correcting code (FEC) or other higher layer protocols. Depending on the system architecture, however, such external sources are not always available and involve extra costs due to required interfaces to these devices.

EP 0 455 910 A2 describes a method for distortion compensation by adaptively setting the decision threshold based on at least one prior decision. In other words, prior decisions are used as feedback signal to adjust the decision threshold for subsequent bits. This is similar to the functional principle of a decision feedback equalizer.

EP 0 923 204 B1 uses a pseudo error monitor to control parameters of a pre-filter in an optical receiver.

The problem to be solved by the present invention is hence to provide a method and related apparatus for determining "good" starting values for a decision threshold and/or decision phase without requiring information on signal offset, noise and/or other signal distortion in advance.

SUMMARY OF THE INVENTION

These and other objects that appear below are achieved by a statistical analysis of the received signal and by setting the decision threshold such that the distribution of logical '0' and logical '1' in the decided signal corresponds to the expected distribution, which is in typically 50%/50%.

In particular, a receiver for a digital communication signal has a first decision gate, which has a first decision threshold for outputting a first decision signal, a second decision gate, which has a second decision threshold for outputting a second decision signal, a counter for counting events where the first and second decision signals of the first and second decision gates differ from each other, and a controller capable of controlling the decision thresholds of said first and second decision gates in accordance with count values delivered by said counter. According to the present invention, the controller is programmed to determine an initial threshold value by setting a first decision threshold to a maximum threshold value where the first decision signal is in low state for every bit in the received signal or to a minimum threshold value where the first decision signal is in high state for every bit in the received signal, by performing counts using the counter for fixed time intervals at different values of the second decision threshold to determine a first measured threshold value where the corresponding count value per time interval approximates a first predetermined value and a second measured threshold value where the corresponding count value per time interval approximates a second predetermined value; and by determining the initial threshold value as a mean value between the first and second measured threshold values.

The decision threshold thus determined is such that decision errors are already quite low. The algorithm according to the invention is suited for signals with low noise as well as with high noise and is also robust against deviations of the 0-1 probability of the transmitted signal (e.g. if 51% of the transmitted bits are '0').

The invention works well for heavily distorted signals as well as for non-distorted signals, is (within a certain range) robust against deviations of the signal statistics. The tolerance range is scalable. The invention is simple, flexible, and requires no additional external devices.

The algorithm according to the invention is preferably implemented as software but can also be implemented in hardware.

BRIEF DESCRIPTION OF THE FIGURES

A preferred embodiment of the invention will be described below with reference to the accompanying drawings, in which.

DETAILED DESCRIPTION OF THE INVENTION

Figure 1:
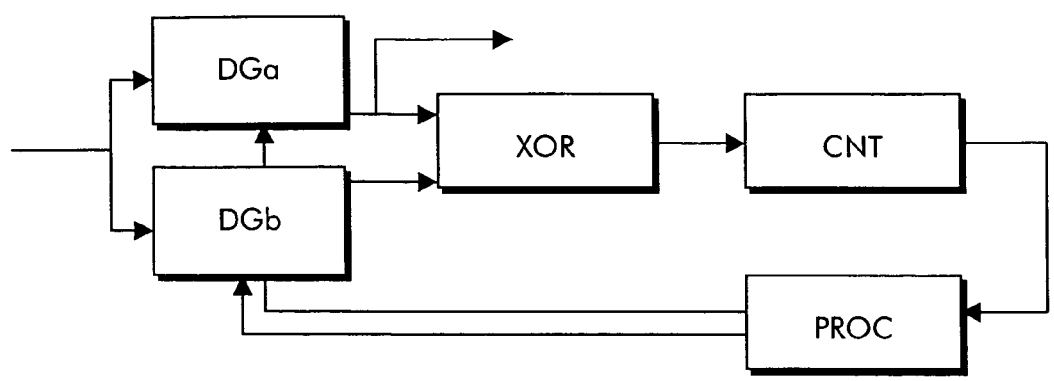
FIG. 1 shows a block diagram of a receiver according to the invention.

A receiver for a digital communication signal is shown in FIG. 1. The communication signal can for example be a data signal, converted using a photodiode from an optical signal after transmission over a fiber link. The communication signal is fed in parallel to two decision gates DGa and DGb. Each decision gate DGa, DGb has a decision threshold and a decision phase that can be adjusted via a control circuit PROC. The control circuit PROC may for example be implemented with a programmable processor and corresponding control software.

The decision signals from the two decision gates DGa, DGb are fed to a XOR gate XOR, which is connected to a counter CNT. The counter is reset and read by the control circuit PROC. Depending on the count values, the control circuit PROC adjusts the decision threshold value and preferably also the decision phase of at least decision gate DGa, which output is also used as the recovered signal. The second decision gate DGb serves as a pseudo error monitor during normal operation.

As explained above, pseudo error monitors are as such known in the art and serve to generate a pseudo error signal by using a detuned decision threshold to decide the received signal. This pseudo error signal serves to adjust the decision threshold of decision gate DGa. However, as will be explained with reference to FIG. 2, this dynamic adjustment requires "good" starting values. Therefore, a basic idea of the present invention is to re-use the existing decision gate DGb of the pseudo error monitor together with the decision gate DGa to perform a statistical analysis of the received signal.

Figure 2:
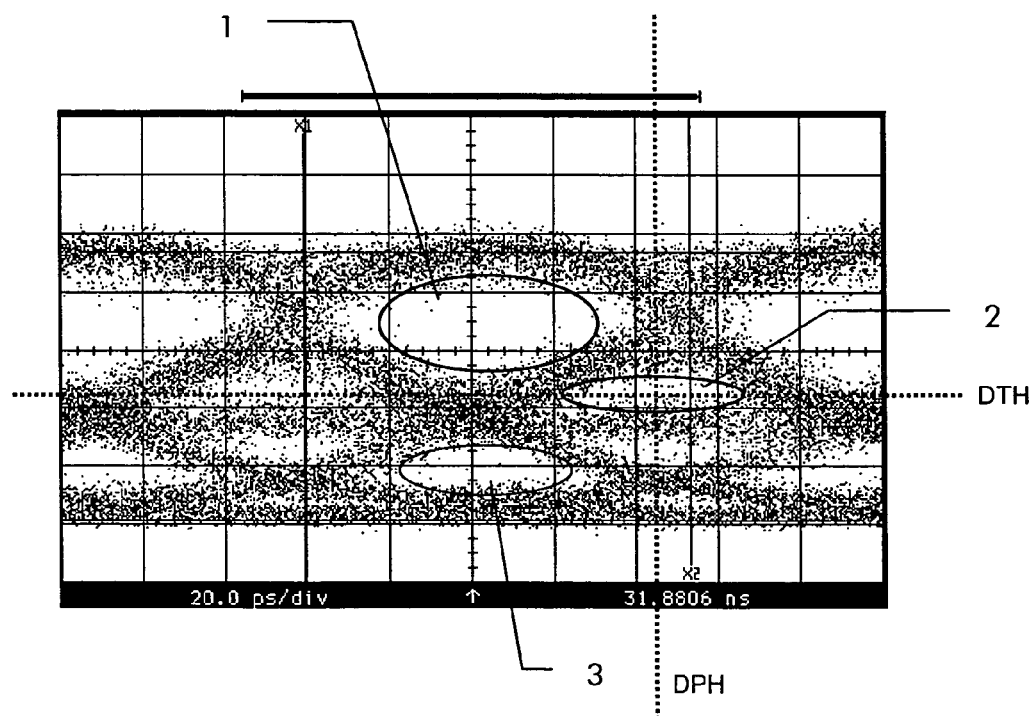
FIG. 2 shows an eye diagram with properly adjusted decision point for a distorted signal.

FIG. 2 shows an eye diagram of a received signal, which is heavily distorted due to chromatic dispersion in the optical domain. The shown eye diagram is for a signal after 89 km single mode fiber (SMF) without dispersion compensation. An eye diagram is a visualization of the received signal which can be typically observed with an oscilloscope. It consists of a time overlap of all distorted waveforms, which differ depending on the bit value of the preceding or even prior bits, respectively.

The decision point, which consists of decision threshold DTH and decision phase DPH must be adjusted such that it lies within an eye opening in the eye diagram. However, due to dispersion, there can be found several more or less well-defined eye openings. Eye opening 1, for example is a wrong eye opening as it yields too few decisions for bit value '1' and eye opening 3 is also a wrong eye opening as it yields too few decisions for bit value '0'. The correct eye opening in this example is eye opening 1. Therefore, decision threshold DTH and decision phase DPH must be adjusted such that the decision is made in eye opening 1.

For the decision phase, a reasonable assumption can be made or several measurements at different decision phases can be made to find a good starting value. In general, communication systems contain a clock recovery circuit that can be designed such that the default phase is in a good position. The more critical value is the decision threshold, which must be set very accurately to achieve a low bit error rate. This starting value for the decision threshold is determined by the algorithm shown in FIG. 3.

The algorithm, we define the following parameters:
mtime: measurement time of error counter
nerr: counted '1's after XOR
ncor: counted '0's after exor
ntot=nerr+ncor
th_min: minimum threshold value
th_max: maximum threshold value
ph_min: minimum phase value
ph_max: maximum phase value
dth: threshold value applied to decision circuit of path A
mth: threshold value applied to decision circuit of path B
dph: phase value applied to decision circuit of path A
mph: phase value applied to decision circuit of path
xm,xd,xd1, ym,yd, nref, n, ref1, ref2, dir: intermediate variables parameters for algorithm: steps, $\alpha,\beta$ We further define following routines:
set_dth(x): set decision threshold in decision curcuit A to value x
set_mth(x): set decision threshold in decision curcuit B to value x
set_dph(y): set decision phase in decision curcuit A to value y
set_mph(y): set decision phase in decision curcuit B to value y
do_measurement ( ): set counter to 0; start pseudo error measurement; stop counter after measurement time 'mtime'
get-nerr ( ): read out number of pseudo errors; return value: counted number pseudo errors The algorithm starts with a first step 30 of assigning the maximum value th_max to the threshold xm of the pseudo error monitor gate DGb and the minimum values th_min to the threshold xd of the decision gate DGa. These values are chosen such that no bit values of the received signal (see FIG. 2) lie below the minimum value th_min and no bit values lie above the maximum value th_max. In step 31, the threshold values are actual set using the commands set_dth(xd) and set_mth(xm).

In the next step 32, the measurement procedure do_measurement( ) is performed and the count value of the counter CNT is read using the command get_err( ) and assigned to a variable nref. The procedure do_measurement( ) counts the output of the XOR gate XOR for a predetermined time interval. Since all bit values lie between the decision thresholds xm and xd of the decision gates DGa and DGb, all bits are counted. The count result in variable nref corresponds thus to the bitrate integrated over the measurement time mtime.

Now, using the value from nref, two reference values ref1 and ref2 are determined in step 33 as ref1=$\alpha$*nref and ref2=$\beta$*nref, where $\alpha$ and $\beta$ are percentage values of 45% and 55%, respectively, in the preferred embodiment. It should be noted that $\alpha$ and $\beta$ can have other values. For a signal with a statistical distribution of logical '1' of r0% and a statistical distribution of logical '0' (100-r0)%, the following condition must hold: a<r0<$\beta$.

Then, the decision threshold xd is incremented in step 34 by the increment value steps and set in the decision gate DGa. In step 35, a new measurement is performed with procedure do_measurement( ) and the count value from counter CNT stored in variable n. In step 36, the count value n previously measured is then compared to the lower reference value nref1. Steps 34 to 36 are repeated until the count value is below reference value nref1. If n exceeds nref1, the corresponding threshold value xd of decision gate DGa is stored in variable xd1.

In a second loop, steps 38 to 310, which are similar to steps 34 to 36 are repeated until the count n exceeds the second reference value nref2. From the threshold value xd thus achieved, which corresponds to nref2 and the previously stored threshold value that corresponds to nref1 the mean value is calculated and stored as new value in xd in step 311 and set as the new threshold of the decision gate DGa. The algorithm thus ends with the result xd as initial value for the decision threshold.

In essence it can be said that the basic principle of the algorithm described above is to determine a decision threshold th1 such that the counter measures get $\alpha$ % '1's after the decision circuit DGa and a decision threshold th2 such that the counter measures β % '1's after the decision circuit DGa. Then the decision threshold is determined as the mean value of th1 and th2.

Figure 3:
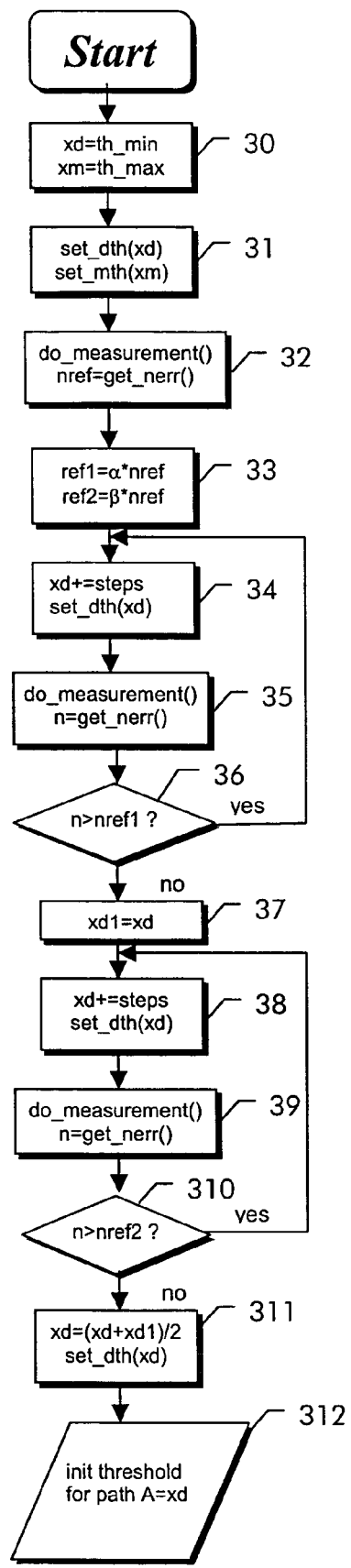
FIG. 3 shows a flow chart of an algorithm for determining an initial threshold value according to the invention.
Figure 4:
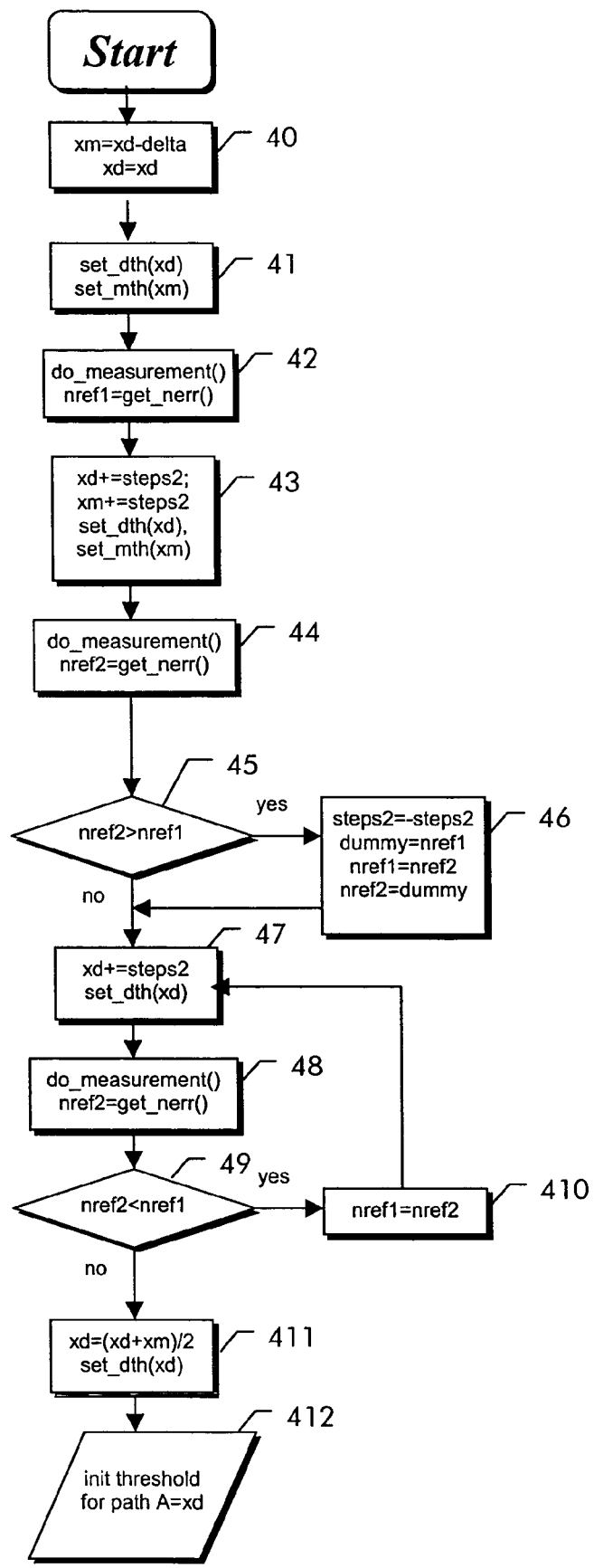
FIG. 4 shows in a second flow chart an improvement to the algorithm of FIG. 3.

An algorithm which provides an improvement to the invention is shown in FIG. 4. This second searches for the local minimum of the probability density function of the signal amplitude. The starting point of this further optimization is the decision threshold value xd found by the algorithm of FIG. 3.

In steps 40 and 41, the threshold of the monitor gate DGb is set close to the value of the decision threshold xd. A measurement is then performed in step 42 and the count value stored in variable nref1. Both threshold values xd and xm are then incremented by a second increment step2 and set to the decision gates DGa and DGb, respectively, in step 43. A new measurement is then performed and the count value stored in variable nref2. (It has to be noted that nref1 and nref2 are just variables and do not have the same value as in the first embodiment.)

If in comparison step 45 nref2 is greater than nref1, the increment is inverted and the values of nref1 and nref2 exchanged using a dummy variable in step 46. The decision threshold xd is then incremented (step 48) by increment step2, which due to the inversion is actually a decrement. In step 49, a new measurement is performed and the value stored in nref2. If in comparison nref2 is smaller than nref1, nref1 is set to nref2 and the steps 47 to 49 repeated until nref2 is greater than nref1. This procedure searches a local minimum until the count value raises again and the minimum is hence crossed. The new initial threshold value is then calculated as the mean between xd and xm and set to DGa in step 411. The algorithm ends thus with a results xd, which is a local minimum of the eye diagram.

Instead of applying the described algorithms from FIGS. 3 and 4 in the threshold domain, it can alternatively be applied in the phase domain and yields a value for the startup phase.

Searching for the decision threshold using the invention implies that a 'reasonable' decision phase is already set. Conversely, searching for the decision phase using the invention implies that a 'reasonable' decision threshold is already set. The measurement times should be long enough in order to minimize statistical deviations. The improvement from FIG. 4 can be repeated several times.

If neither decision phase nor decision threshold is known in advance, the following procedure will yield the startup values for phase and threshold
a) determine a set S of possible decision phase values. let s_i be the i-th member of set S;
b) set decision phase to value s_1;
c) apply the first algorithm of FIG. 3 and the subsequent improvement of FIG. 4 in the threshold domain;
d) store the probability density function (e.g. the number of measured pseudo error events) that corresponds to the found decision threshold and decision phase;
e) store the threshold value that was derived as startup threshold for decision phase s_i; this threshold value is denoted as d_i;
f) repeat a) to e) for all members of S;
g) determine index 'r' that yields minimum probability density function for phase s_r and threshold t_r;
h) it follows: s_r is the startup phase, t_r is the startup threshold.

In general, instead of using the minimum probability density function, other criterions can be derived to determine best phase setting, e.g. the eye-opening.

In experiments, the described algorithm has proved workable for any bit error rate BER<$5 \times 10^{-3}$ with any uncompensated chromatic dispersion. This has been verified for fiber lengths of 0 km, 38 km, 78 km, and 89 km.

It should be noted that the described algorithms are only non-limiting, preferred embodiments of the invention and that various modifications would be apparent to those skilled in the art having read and understood the concepts of the invention.

It should be clear for example, that instead for setting the threshold GDa to the minimum threshold value and GDb to the maximum threshold value and to increase GDa stepwise, the method can be performed the other way round, i.e. by setting the threshold GDa to a maximum value and GDb to a minimum value and to decrease GDa stepwise. Moreover, it should be clear that the values of 45% and 55% for the maximum and minimum threshold values are only non-limiting examples used in the preferred embodiment and that other suitable values can also be used.

The invention claimed is:

1. A receiver for a digital communication signal, comprising
a first decision gate having a first decision threshold for outputting a first decision signal;
a second decision gate having a second decision threshold for outputting a second decision signal;
a counter for counting events where said first and second decision signals of said first and second decision gates differ from each other;
and a controller capable of controlling the decision thresholds of said first and second decision gates in accordance with count values delivered by said counter, wherein said controller is operable to determine an initial decision threshold value by
setting said first decision threshold to a maximum threshold value where the first decision signal is in low state for every bit in said received signal or to a minimum threshold value where the first decision signal is in high state for every bit in said received signal,
performing counts using said counter for fixed time intervals at different values of said second decision threshold to determine a first measured threshold value where the corresponding count value per time interval approximates a first predetermined value and a second measured threshold value where the corresponding count value per time interval approximates a second predetermined value; and
determining said initial threshold value as a mean value between said first and second measured threshold values.

2. The receiver according to claim 1, wherein said controller is programmed to set said first decision threshold to a minimum threshold value where the first decision signal is in high state for every bit in said received signal, to set said second decision threshold to a maximum threshold value where the second decision signal is in low state for every bit in said received signal, and to increment the first decision threshold for every count cycle.

3. The receiver according to claim 1, wherein said controller is operable to search in a further algorithm a local minimum by setting said first and second decision threshold values close together and varying at least one of them until the count results a minimum count value per time interval.

4. The receiver according to claim 1, wherein said minimum threshold value and said maximum threshold value are chosen to 45% and 55%, respectively, of a total number of bits per time interval in said received signal.

5. The receiver according to claim 1, wherein said controller is operable to repeat said steps to determine an initial threshold value for different decision phase values.

6. The receiver according to claim 1, wherein said controller is operable to use decision phase values instead of decision threshold values and perform said steps of determining to determine an initial value is performed in the phase domain, rather than in the threshold domain and yields an initial decision phase value.

7. A method for determining an initial decision threshold value for a decision gate of a receiver for a digital communication signal, said receiver comprising
- a first decision gate having a first decision threshold for outputting a first decision signal;
- a second decision gate having a second decision threshold for outputting a second decision signal;
- a counter for counting events where said first and second decision signals of said first and second decision gates differ from each other; and wherein said method comprises the steps of setting said first decision threshold to a maximum threshold value where the first decision signal is in low state for every bit in said received signal or to a minimum threshold value where the first decision signal is in high state for every bit in said received signal, performing counts using said counter for fixed time intervals at different values of said second decision threshold to determine a first measured threshold value where the corresponding count value per time interval approximates a first predetermined value and a second measured threshold value where the corresponding count value per time interval approximates a second predetermined value; and determining said initial threshold value as a mean value between said first and second measured threshold values.

* * * * *